US 8,183,881 B1

(12) United States Patent
Stassart et al.

(10) Patent No.: US 8,183,881 B1
(45) Date of Patent: *May 22, 2012

(54) CONFIGURATION MEMORY AS BUFFER MEMORY FOR AN INTEGRATED CIRCUIT

(75) Inventors: Benjamin J. Stassart, Los Gatos, CA (US); Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1851 days.

This patent is subject to a terminal disclaimer.

(21) Appl. No.: 10/813,414

(22) Filed: Mar. 29, 2004

(51) Int. Cl.
*G06F 7/38* (2006.01)
*H03K 19/173* (2006.01)

(52) U.S. Cl. ............ 326/38; 380/44; 380/217; 713/189; 713/190; 713/191; 326/39; 326/41; 365/201; 710/72; 710/240; 710/305; 714/33; 714/39; 712/43; 716/104; 716/101; 716/116; 716/117

(58) Field of Classification Search .................... 380/217
See application file for complete search history.

(56) References Cited

U.S. PATENT DOCUMENTS

| | | | |
|---|---|---|---|
| 5,483,539 A * | 1/1996 | Kaufmann | 370/509 |
| 6,496,971 B1 | 12/2002 | Lesea et al. | |
| 6,625,794 B1 * | 9/2003 | Trimberger | 326/38 |
| 6,931,543 B1 * | 8/2005 | Pang et al. | 713/193 |
| 6,981,153 B1 * | 12/2005 | Pang et al. | 713/194 |
| 7,200,235 B1 * | 4/2007 | Trimberger | 380/277 |
| 7,412,635 B1 * | 8/2008 | Trimberger | 714/725 |
| 7,484,081 B1 * | 1/2009 | Langhammer et al. | 713/1 |
| 7,653,820 B1 * | 1/2010 | Trimberger | 713/191 |
| 2001/0015919 A1 * | 8/2001 | Kean | 365/200 |
| 2003/0086300 A1 * | 5/2003 | Noyes et al. | 365/189.01 |

* cited by examiner

*Primary Examiner* — Nathan Flynn
*Assistant Examiner* — Bryan Wright
(74) *Attorney, Agent, or Firm* — W. Eric Webostad; John J. King; Thomas George

(57) ABSTRACT

Method and apparatus for using configuration memory for buffer memory is described. Drivers associated with a portion of the configuration memory are rendered incapable of creating a contentious state irrespective of information stored the portion of configuration memory. Configuration data is received in a non-configuration data format and buffered in the portion of the configuration memory.

24 Claims, 8 Drawing Sheets

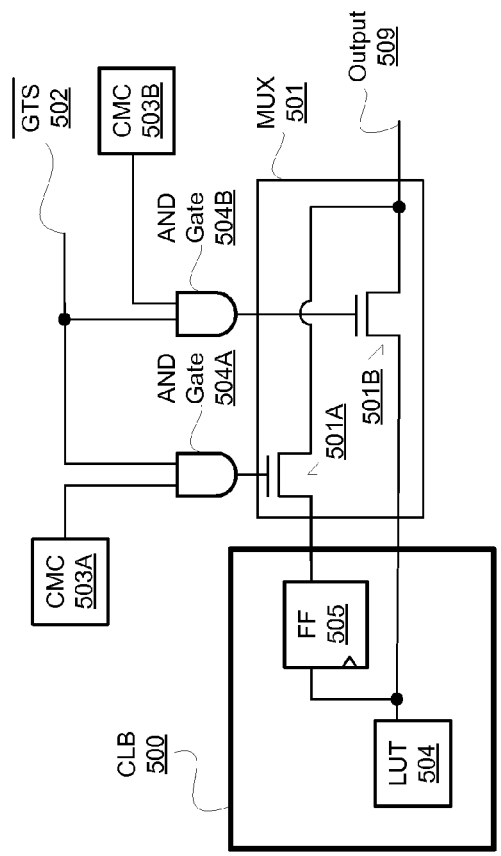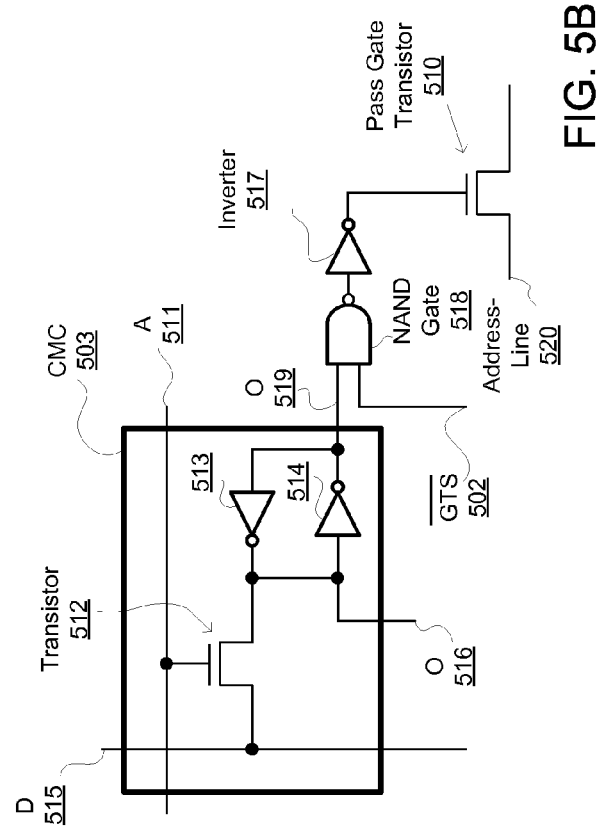
FIG. 5A
FIG. 5B

CONFIGURATION MEMORY AS BUFFER MEMORY FOR AN INTEGRATED CIRCUIT

FIELD OF THE INVENTION

One or more aspects of the invention relate generally to an integrated circuit with configuration memory for configurable circuitry.

BACKGROUND OF THE INVENTION

Programmable logic devices ("PLDs") exist as a well-known type of integrated circuit ("IC") that may be programmed by a user to perform specified logic functions. There are different types of programmable logic devices, such as programmable logic arrays ("PLAs") and complex programmable logic devices ("CPLDs"). One type of a programmable logic device, called a field programmable gate array ("FPGA"), is very popular because of a superior combination of capacity, flexibility, time-to-market, and cost.

An FPGA typically includes an array of configurable logic blocks ("CLBs") and programmable input/output blocks ("IOBs"). The CLBs and IOBs are interconnected by a programmable interconnect structure. The CLBs, IOBs, and interconnect structure are typically programmed by loading a stream of configuration data ("bit-stream") into internal configuration memory cells that define how the CLBs, IOBs, and interconnect structure are configured. CLBs and IOBs form the programmable part of an FPGA referred to as the "FPGA fabric", which is subject to program control of the configuration memory cells. Similarly, the interconnect structure is programmable via programmable interconnect points ("PIPs"). Each IOB, CLB and PIP conventionally includes or has associated therewith a configuration memory cell. FPGAs may also contain other types of known circuitry.

Heretofore, configuration memory was not used as buffer memory.

Configuration memory controls configurable logic. By storing configuration data in a non-configuration data format, such as an encrypted or a compressed format, configuration memory heretofore could lead to creation of one or more contending electrical paths ("electrically contentious on-chip environment"). An electrically contentious on-chip environment may consume excessive amounts of power and may lead to burning up the programmable logic device.

To guard against such contention, software has been created to check a design prior to instantiation in configurable logic to ensure that no contending electrical paths will be created. Moreover, error checking of received data frames of configuration data is done by a programmable logic device to ensure that bits have not changed from their intended value, which if written to configuration memory may setup contending electrical paths. Thus, heretofore to store encrypted or compressed configuration data, even temporarily, in configuration memory could lead to a catastrophic result.

However, users of programmable logic devices may use millions or tens of millions of bits to configure a programmable logic device. Because configuration data often contains sensitive information regarding a design, it would be desirable to encrypt such configuration data before providing it to a programmable logic device for receipt in encrypted form by such programmable logic device.

Unfortunately, decryption may take too many clock-cycles and may use many available dedicated on-chip frame buffers. To limit latency, while providing on-chip decryption, dedicated decryption circuitry is conventionally formed on a programmable logic device. This dedicated decryption circuitry, while limiting clock-cycle latency, consumes a significant amount of area of the programmable logic device. Moreover, accommodating a variety of available decryption algorithms may further consume area of the programmable logic device.

Additionally, because configuration data may be relatively voluminous, it may be desirable to store it in a compressed form. This would reduce external memory used for storing configuration data. However, on-chip decompression would further consume clock cycles possibly exceeding on-chip frame buffers absent dedicated on-chip decompression circuitry.

Conventionally, configuration data is clocked into a programmable logic device, whether serially or in parallel, from external memory. Though each bit or each word is clocked into memory at a time, configuration data is provided in data frames. In implementations with a "handshake" signal, a data clock rate may be slowed to accommodate slower processing by a programmable logic device. However, in implementations where no such handshake signal is present, data clock rate ("line rate") is not subject to control by the programmable logic device. Thus, slowing data clock rate to accommodate on-chip decryption or decompression, for example, is not available in those implementations.

Accordingly, it would be desirable to provide a programmable logic device where configuration memory may be used to buffer configuration data in an encrypted or compressed form.

SUMMARY OF THE INVENTION

An aspect of the invention is an integrated circuit having configuration memory for programmable logic, comprising: a configuration data interface; a microcontroller coupled to the configuration data interface for receiving configuration data in a non-configuration data format, the microcontroller having access to at least one set of instructions for converting the configuration data to a configuration data format; configuration memory coupled to the microcontroller; and the microcontroller configured to assert a disable signal to disable drivers associated with the configuration memory to create a non-contentious environment for at least a portion of the configuration memory, the microcontroller configured to write the configuration data in the non-configuration data format to the portion of the configuration memory and to read the configuration data back from the portion of the configuration memory for conversion into the configuration data format responsive to the set of instructions.

Another aspect of the invention is a method for using configuration memory for buffer memory, comprising: obtaining configuration initialization information; obtaining instructions responsive to the configuration initialization information; disabling drivers associated with a portion of the configuration memory to provide disabled drivers therefor; receiving configuration data in a non-configuration data format; and buffering the configuration data in the portion of the configuration memory having the drivers disabled.

Yet another aspect of the invention is a method for using configuration memory for buffer memory, comprising: rendering drivers associated with a portion of the configuration memory incapable of creating a contentious state irrespective of information stored therein; receiving configuration data in a non-configuration data format; and buffering the configuration data in the portion of the configuration memory.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 5A is a block/schematic diagram depicting an exemplary embodiment of a CLB coupled to a configuration memory cell.

FIG. 5B is a schematic diagram depicting an exemplary embodiment of the configuration memory cell of FIG. 5A coupled to a pass gate transistor.

DETAILED DESCRIPTION OF THE DRAWINGS

Figure 1:
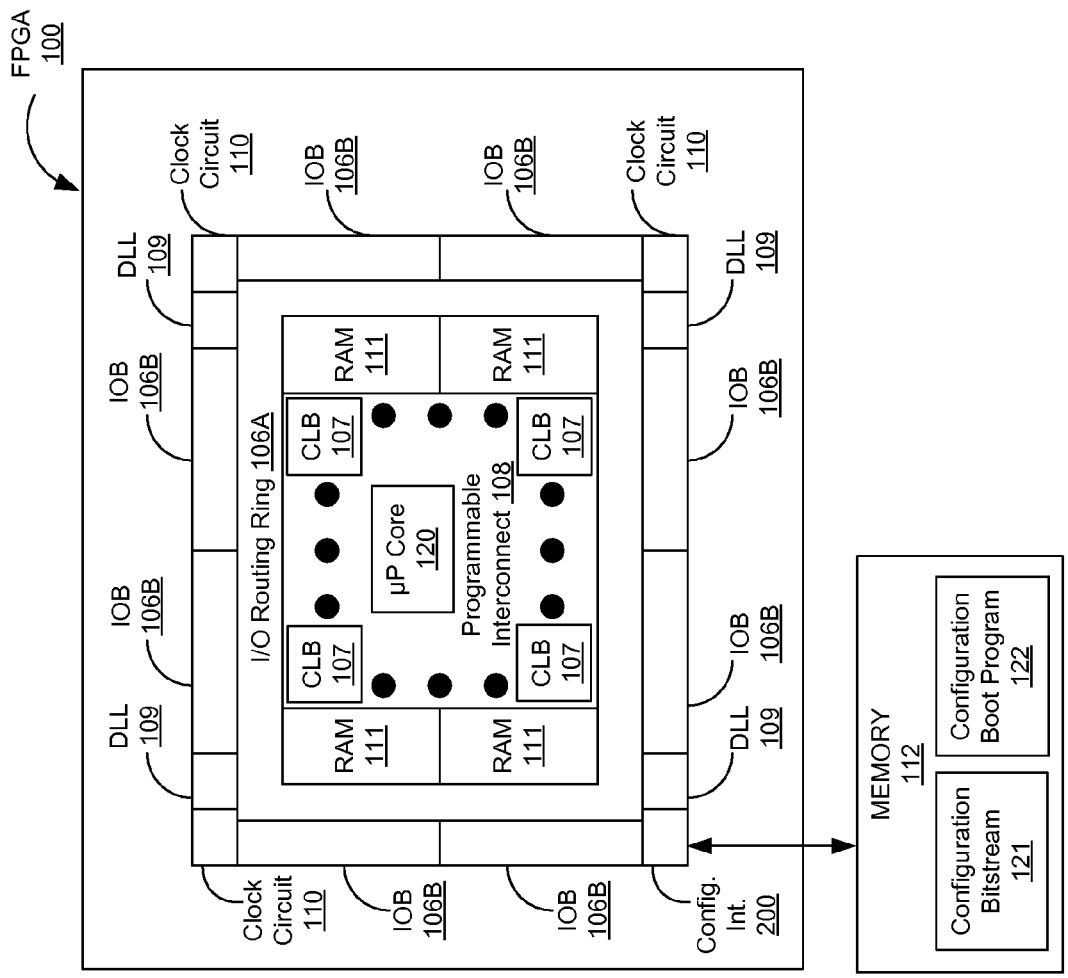
FIG. 1 is a high-level block diagram depicting an exemplary embodiment of an FPGA.

FIG. 1 is a high-level block diagram depicting an exemplary embodiment of an FPGA 100. An FPGA 100 is an example of an integrated circuit that may be used for implementing one or more aspects of the invention. However, other programmable logic device ("PLD") integrated circuits other than FPGAs, including complex PLDs ("CPLD") and other integrated circuits with configurable logic, may be used.

FPGA 100 includes configurable logic blocks (CLBs) 107, I/O routing ring 106A, memory, such as random access memory 111, delay lock loops (DLLs) 109, multiply/divide/de-skew clock circuits 110, and programmable input/output blocks (IOBs) 106B. IOBs 106B may include transceivers, such as multi-gigabit transceivers ("MGTs"). DLLs 109 and clock circuits 110 collectively provide digital clock modules or managers (DCMs). Programmable interconnect 108 are used to selectively interconnect CLBs 107 to one another and to IOBs 106B via I/O routing ring 106A. External memory 112 may be coupled to FPGA 100 to store and provide a configuration bit-stream 121 to configure FPGA 100, namely, to program one or more memory cells to configure CLBs 107 and IOBs 106B, as well as PIPs of programmable interconnect 108. Furthermore, memory 112 may store a configuration boot program 122 for booting FPGA 100 for configuration.

FPGA 100 may include an embedded microprocessor core 120. Notably, FPGA 100 may include more than one microprocessor core 120. Additionally, conventionally support circuitry for interfacing with embedded microprocessor core 120 may be included in FPGA 100. FPGA 100 includes a configuration interface block 200.

Figure 2:
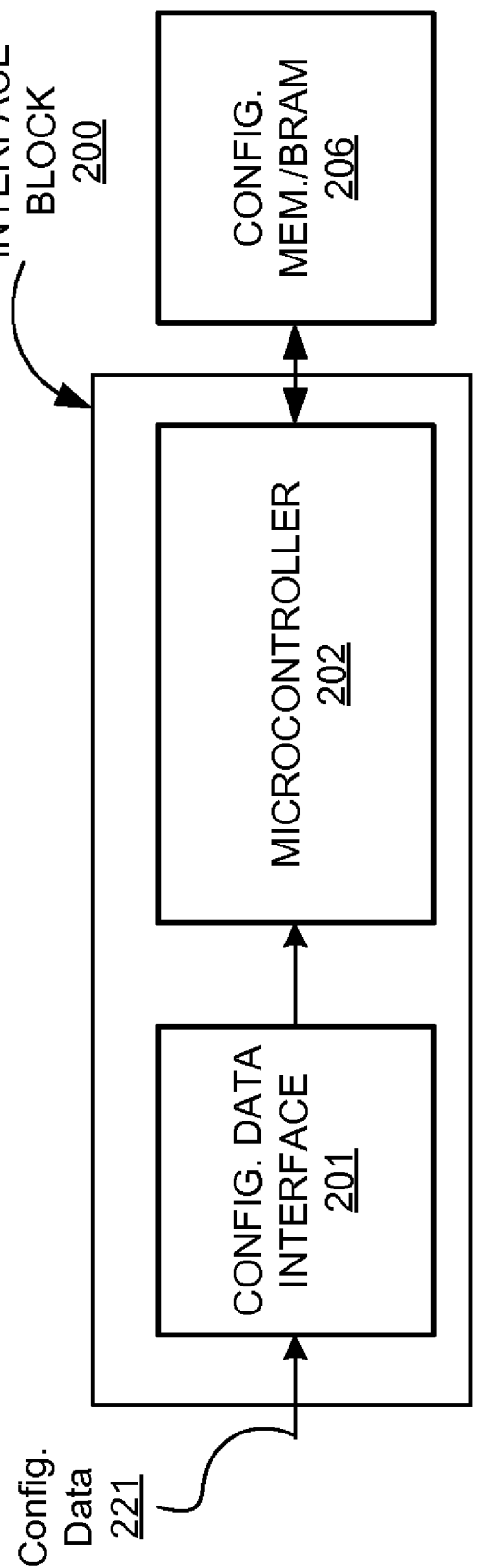
FIG. 2 is a block diagram depicting an exemplary embodiment of a configuration interface block coupled to configuration memory.

FIG. 2 is a block diagram depicting an exemplary embodiment of a configuration block 200 coupled to configuration memory 206. Notably, configuration interface block 200 may be coupled to block random access memory ("BRAM") in addition to being coupled to configuration memory 206. However, conventionally there is an insufficient amount of BRAM to buffer configuration data for decryption.

Configuration data 221 is provided to configuration data interface 201. Configuration data 221 may include initialization information. Examples of initialization information are the data-line rate, namely, the rate at which data will be provided to configuration interface 201, a type of decryption algorithm to be used, a type of error checking algorithm to be used, and a type of authentication to be used.

Figure 3:
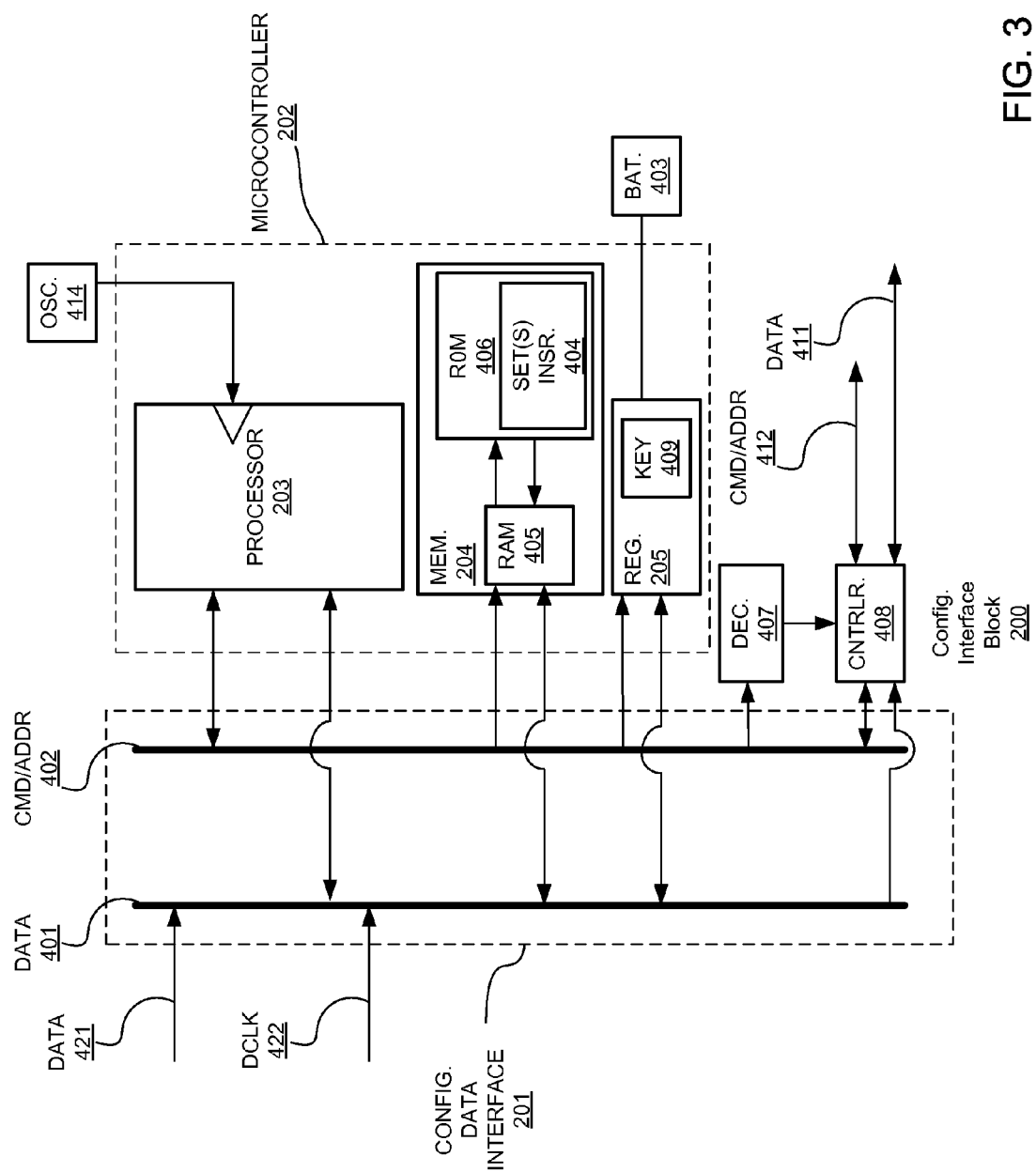
FIG. 3 is a block/schematic diagram depicting an exemplary embodiment of the configuration interface block of FIG. 2.

FIG. 3 is a block/schematic diagram depicting an exemplary embodiment of configuration interface block 200. Configuration interface block 200 includes microcontroller 202 and configuration data interface 201. Optionally, decoder 407 and controller 408 may form a part of configuration interface block 200, as well as oscillator 414.

Microcontroller 202 includes processor 203 and memory 204 and registers 205. Processor 203 may be clocked from oscillator 414 at clock-cycle rate the same as or different from data clock 422. Processor 203 may be a hardcore processor such as a power PC from IBM Corp. of White Plains, N.Y. or a hardcore processor such as a MicroBlaze from Xilinx Corp. of San Jose, Calif.

Configuration data 421, including any initialization information, as described above, is provided to data bus 401. Additionally, data clock 422 may be provided to data bus 401. Data bus 401 and command/address bus 402 are at least a portion of configuration data interface 201.

Registers 205 are for storing a decryption key 409 for authentication and decryption. Registers 205 may be formed of non-volatile memory elements, such as flash memory, EEPROM, and the like. Alternatively, a battery 403 may be used to supply power to register 205 during power-down of configuration interface block 200.

Processor 203 is coupled to data bus 401 and command/address bus 402. Configuration data 421, including initialization information, is obtained by processor 203, which in response accesses one or more sets of instructions 404 from ROM 406 of memory 204. Such sets of instructions may be temporarily stored in RAM 405 of memory 204 for executing by processor 203. Memory 204 via RAM 405 is coupled to data bus 401 and command/address bus 402 for communicating with processor 203 and for obtaining configuration data for storing. Notably, instructions 404 may be obtained from memory other than ROM 406. For example, instructions 404 may be obtained from other internal memory of FPGA 100 of FIG. 1 or may be obtained from external memory coupled to or in communication with FPGA 100.

Figure 4:
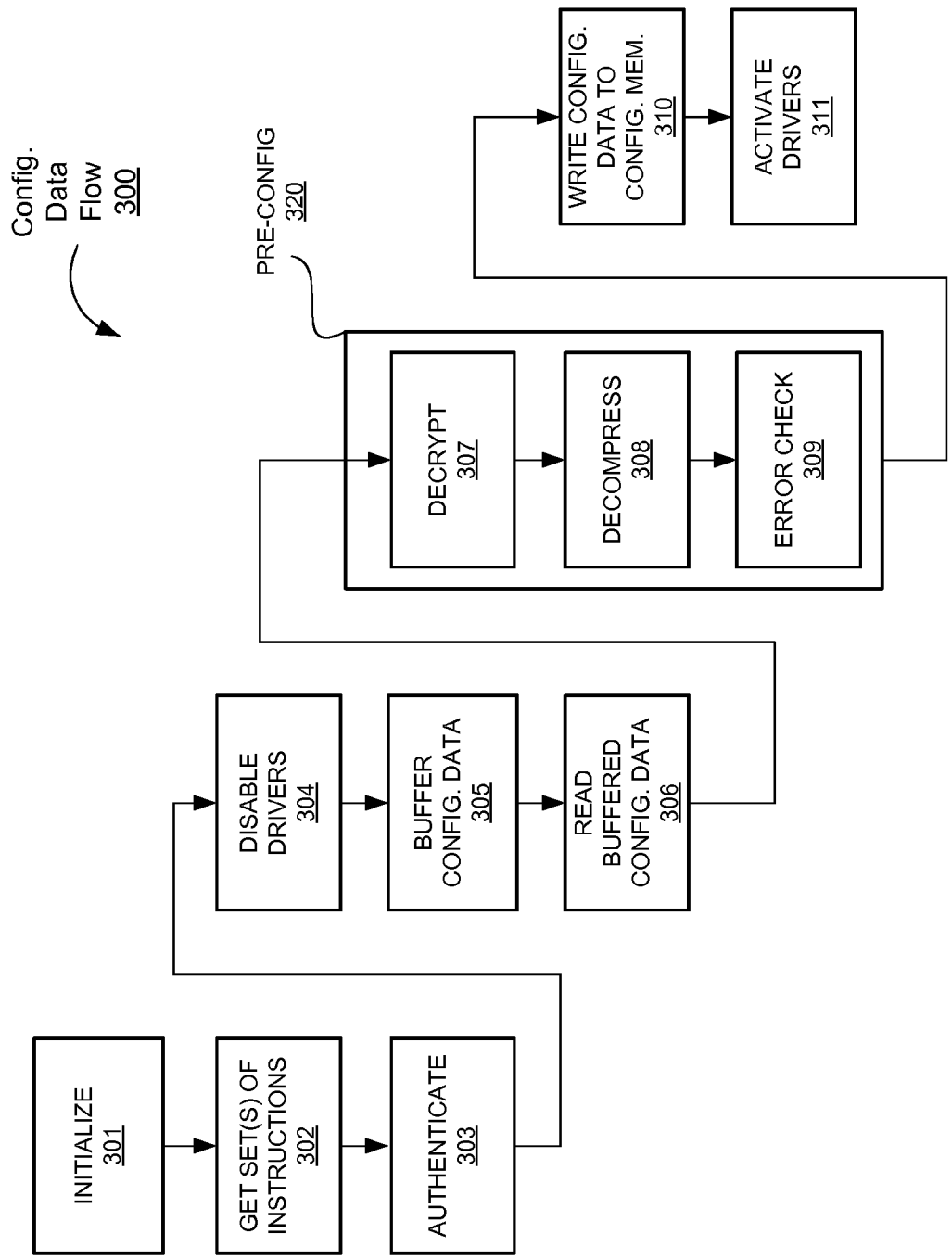
FIG. 4 is a block diagram depicting an exemplary embodiment of a configuration data flow.

Once configuration data has gone through one or more pre-configuration processing steps, described in additional detail with reference to FIG. 4, including without limitation authentication with decryption key 409, address information is provided to decoder 407.

Decoder 407 decodes such address information and provides such decoded address information to controller 408. Controller 408 issues command/address information signals 412 in response thereto. Command/address signals 412 include global or chip-wide signals for disabling selected drivers in accordance with identified addresses.

Controller 408 is coupled to data bus 401 and command/address bus 402. Decoder 407 is coupled to command/address bus 402. After disabling drivers, configuration data passes from data bus 401 through to controller 408. Configuration data passing through controller 408 is provided in a non-configuration data format as data signals 411 for buffering in a portion of configuration memory having drivers disabled.

Processor 203, when ready to execute instructions in RAM 405 for pre-configuration processing of configuration data, sends command/address information to the controller 408 to read buffered non-configuration formatted data from configuration memory. Read data is provided to processor 203 for processing in accordance with instructions stored in RAM 405. Instructions to processor 203 for processing of read configuration data may include one or more of decryption in accordance with a selected decryption set of instructions, decompression in accordance with a selected set of instructions or other form of decoding. Notably, any known decryption, decompression or other decoding instructions may be stored in ROM 406 of memory 204 for processing encoded configuration data.

After processing by processor 203, configuration data, now in a configuration data format, is provided to controller 408 via data bus 401 along with address information provided to decoder 407 via command/address bus 402. Decoder 407 decodes the address information, and provides the decoded address information to controller 408. Controller 408 takes the decoded address information and writes the pre-configuration processed configuration data to configuration memory responsive to the address information.

While programmable logic devices may include one or more embedded processors, such as general-purpose microprocessors, to use such an embedded processor for microcontroller 202 would involve partially programming a programmable logic device prior to free flow of configuration data for configuring such programmable logic device. Furthermore, rather than an embedded processor, a processor instantiated with configurable logic may be used. Accordingly, configuration would be done in two separate steps. To avoid this, processor 203 may be a special purpose processor formed of application specific or dedicated logic for one or more of decryption, decompression, and error checking. Moreover, processor 203 need not be a special purpose microprocessor, but may be a sequencer.

Alternatively, configuration data 221 may include a boot core for booting FPGA 100 with microcontroller 202. Responsive to receiving configuration information 221, microcontroller 202 is instantiated in configurable logic and programmable interconnects.

FIG. 4 is a block diagram depicting an exemplary embodiment of a configuration data flow 300. At 301 a microcontroller is initialized. By initialization of a microcontroller, a line rate may be determined. If the line rate is too high relative to the line/conversion rate at which the microcontroller is able to process configuration data, such as decrypt, decompress, and/or error check, then such configuration data is to be buffered. Optionally a check may be made to determine whether an overflow condition will arise. However, rather than doing such a check, such configuration data received may be directly buffered without such a check to avoid or reduce the possibility of an overflow condition.

At 302, one or more sets of instructions are obtained from memory by a microcontroller. The microcontroller obtains one or more sets of instructions in order to process configuration data in accordance with initialization information obtained at 301. For example, if a particular decryption, decompression or error-checking algorithm is needed to process received configuration data, and then sets of instructions associated with such algorithm or algorithms are obtained at 302.

Configuration data may be authenticated, such as with a stored cryptographic key, at 303 prior to writing to configuration memory. However, any well-known form of authentication may be used.

At 304, drivers for configuration memory are disabled or otherwise put into a state in which data being stored in such configuration memory cannot create a contentious environment. For example, drivers having outputs that are wire OR'd are conditioned to have the same output value such that no contention may arise. Alternatively, pass gates may be turned off such that outputs of drivers are not available.

At 305, configuration data, in a non-configuration data format, is buffered in configuration memory having disabled drivers. It should be appreciated that the amount of configuration data, assuming that encryption and error-checking does not add a significant number of bits, may be reasonably buffered in view of the amount of configuration memory to which it is intended to be written without compression. However, because non-configuration formatted data is buffered in configuration memory while writing other configuration formatted data to configuration memory, only a portion of configuration memory may have associated drivers disabled at a time. In this manner, non-configuration formatted data may be stored while formatted configuration data is written to configuration memory.

At 306, non-configuration formatted data is read from configuration memory having disabled drives associated therewith. Such data may be read from an auxiliary output port, such as a complimented output port, which is not used for controlling logic or interconnects. Notably, data may be buffered in configuration memory in the order in which it is received, and read-out in the order in which it is obtained, namely, first-in, first-out buffering. Notably, an offset from the first frame may be used, as described below in additional detail, for buffering.

At 320, one or more pre-configuration operations may be done. For example, if read back buffered configuration data is encrypted, then at 307 such read back data is decrypted. If such decrypted information is compressed, then at 308 readback configuration data is decompressed. Additionally, after decryption and decompression, configuration data, now in a configuration data format, may be error-checked at 309, such as using a CRC code, to mitigate against storing the wrong bit-value.

At 310, configuration data, in a configuration data format, is written to configuration memory, not having disabled drivers. At 311, after removing buffered non-configuration formatted data from configuration memory, drivers that had been disabled may be activated.

FIG. 5A is a block/schematic diagram depicting an exemplary embodiment of a CLB 500 coupled to configuration memory cells 503A/B. CLB 500 includes look-up table ("LUT") 504 and a flip-flop ("FF") 505. Output of LUT 504 is a data input to FF 505 and an input to an output multiplexer ("multiplexer") 501. Output of FF 505 is provided as an input to multiplexer 501.

Output of configuration memory cells 503A/B is provided as an input to AND gates 504A/B. Another input to AND gates 504A/B is a global tri-state signal ("GTS") 502. Global tri-state signal 502 may be provided from controller 408 to disable drivers, as described above. Global tri-state signal 502 causes output of AND gates 504A/B to disable output of multiplexers 501A/B responsive to assertion of global tri-state signal 502. Accordingly, output 509 of multiplexer 501 having been disabled may not cause contention. Thus, configuration memory cells 503A/B may be used as buffer memory, as described above.

FIG. 5B is a schematic diagram depicting an exemplary embodiment of configuration memory cell 503 coupled to a pass gate transistor 510. Address-line 511 passing through configuration memory cell 503 is coupled to a gate of transistor 512. Cross-coupled inverters 513 and 514 form a latch. Data-line 515 passing through configuration memory cell 503 is coupled to a source terminal of transistor 512.

A drain terminal of transistor 512 is coupled to the output of inverter 513 and the input of inverter 514. Output of inverter 513 is output 516 of configuration memory cell 503. Another output of configuration memory cell 503 is output 519, which is obtained from the output of inverter 514. The output of inverter 514 is provided as an input to inverter 513 and as an input to NAND gate 518. Another input to NAND gate 518 is global tri-state signal 502. Output of NAND gate 518 is input to inverter 517. The output of inverter 517 is used to gate pass transistor 510.

When asserted, global tri-state signal 502 causes output of NAND gate 518, and thus output of inverter 517, to put transistor 510 in an a substantially non-conductive state. Thus, address-line 520 is open with respect to communicating information across transistor 510. Accordingly it should be appreciated that NAND gate 518 and inverter 517 in combination provide AND gates 504A/B of FIG. 5A. This creates an open switch for disabling a driver, such as output multiplexer 501 of FIG. 5A.

Alternatively, outputs of drivers may be passed provided all such outputs are the same. If all such outputs are the same, no contention will arise because all outputs are the same. To force the same value for all signals, wires may be effectively shorted by driving them all to the same value on the same wire.

Figure 6A:
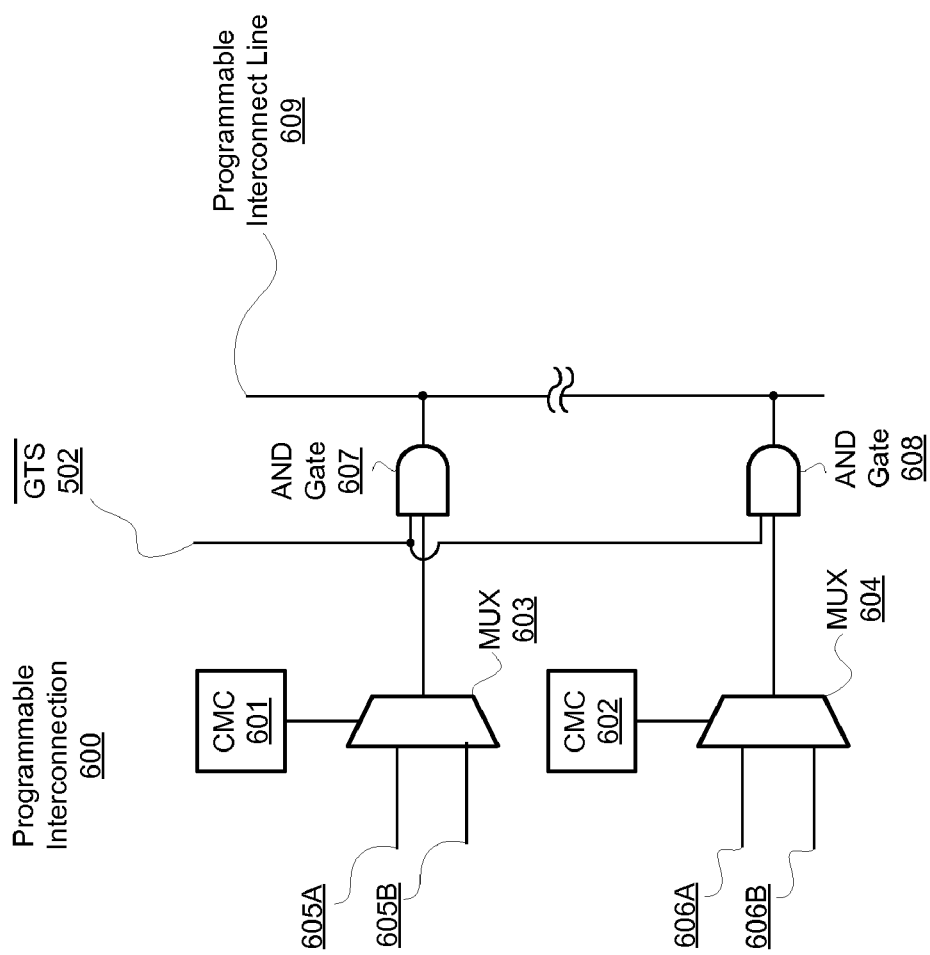
FIGS. 6A and 6B are schematic/block diagrams depicting respective exemplary embodiments of programmable interconnects.

FIG. 6A is a schematic/block diagram depicting an exemplary embodiment of a programmable interconnection 600. Outputs of configuration memory cells 601 and 602 are respectively used as control signals to multiplexers 603 and 604. Multiplexers 603 and 604 are drivers for programmable interconnect 600. Inputs 605A/B and inputs 606A/B respectively provided to multiplexers 603 and 604 are allowed to pass to outputs of those multiplexers. Global tri-state signal 502 is provided to gates of pass transistors (or AND gates) 607 and 608. Output of multiplexer 603 is coupled to a source terminal of pass transistor (or AND gate) 607, and output of multiplexer 604 is coupled to a source terminal of pass transistor (or AND gate) 608. Drain terminals of transistors 607 and 608 (or outputs of AND gates 607 and 608) are connected to interconnect line 609.

If outputs from memory cells 601 and 602 are both logic one, then contention will arise on programmable interconnect line 609 if GTS signal 502 is not asserted. However, GTS signal 502 is asserted (GTS_bar=0) to put pass transistor 607 and 608 into a substantially non-conductive state to disable output of drivers multiplexers 603 and 604 from reaching interconnect 609. Alternatively, input signals 605 and 606 may be forced to the same value for passing through multiplexers 603 and 604, respectively. In which embodiment, if GTS signal 502 is not asserted allowing input signals 605 and 606 to pass to interconnect 609, no contention will arise since input signal 605 and 606 have the same value.

Figure 6B:
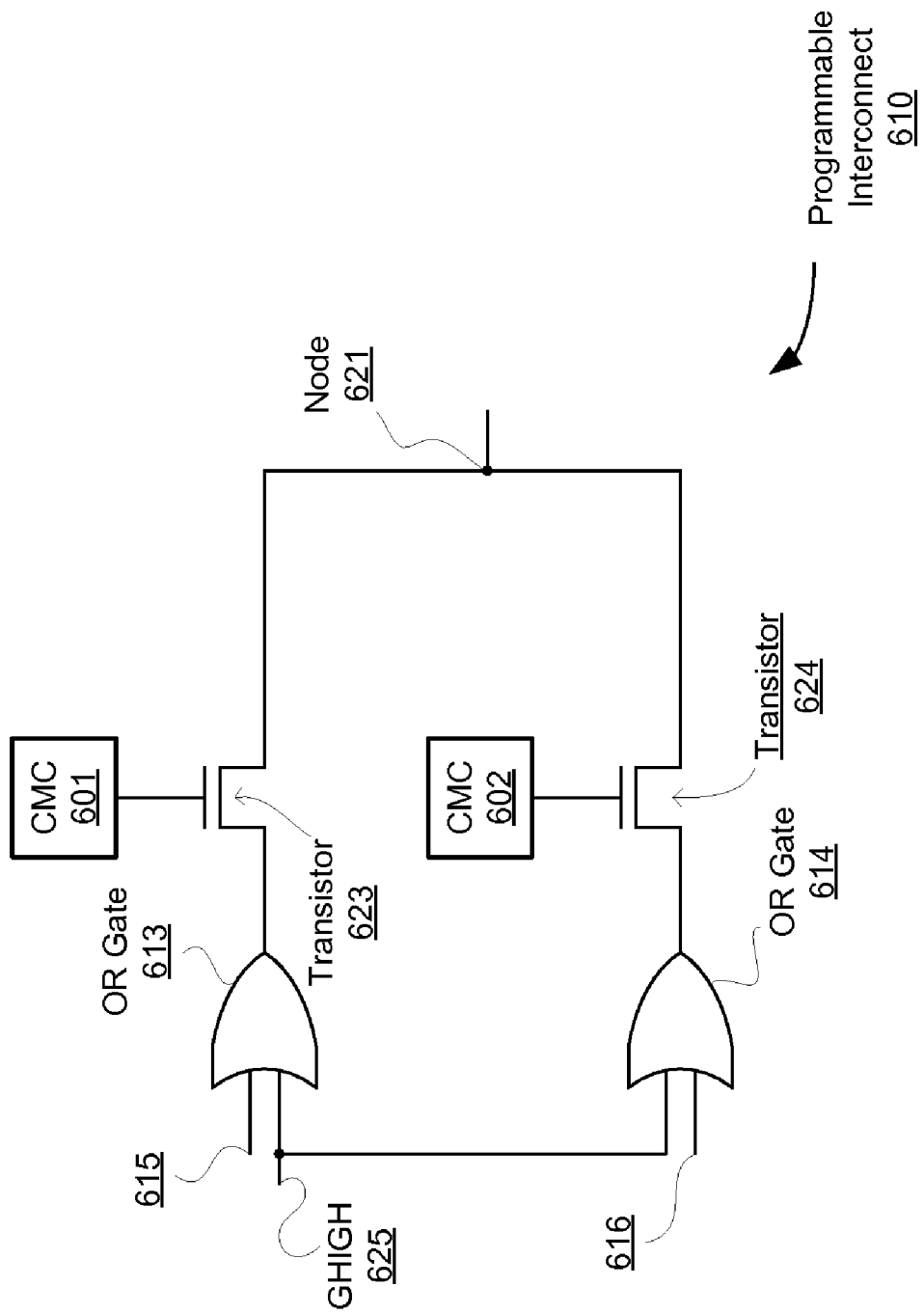

FIG. 6B is a schematic/block diagram depicting an exemplary embodiment of a programmable interconnect 610. Input signals 615 and 616 are respectively provided to drivers 613 and 614 (shown as OR gates). Outputs from memory cells 601 and 602 are provided to gates of respective transistors 623 and 624. Outputs from drivers (or OR gates) 613 and 614 are respectively provided to source terminals of transistor 623 and 624. Drain terminals of transistors 623 and 624 are connected to node 621. The gates of transistors 623 and 624 are connected to CMC 601 and 602, respectively.

If input signals 615 and 616 are forced to a same value with GHIGH not asserted, and passed to node 621, no contention will arise. Accordingly, configuration memory cells 601 and 602 may be used for buffer memory, as described above.

Alternatively, if input signals 615 and 616 are not forced to the same value, and if outputs from configuration memory cells 601 and 602 are both logic high, thereby causing transistors 623 and 624, respectively, to be put in a substantially conductive state, GHIGH 625 may be asserted to force the outputs of drivers (or OR gates) 613 and 614 to the same state. Accordingly, there will not be any contention at common node 621.

Figure 7A:
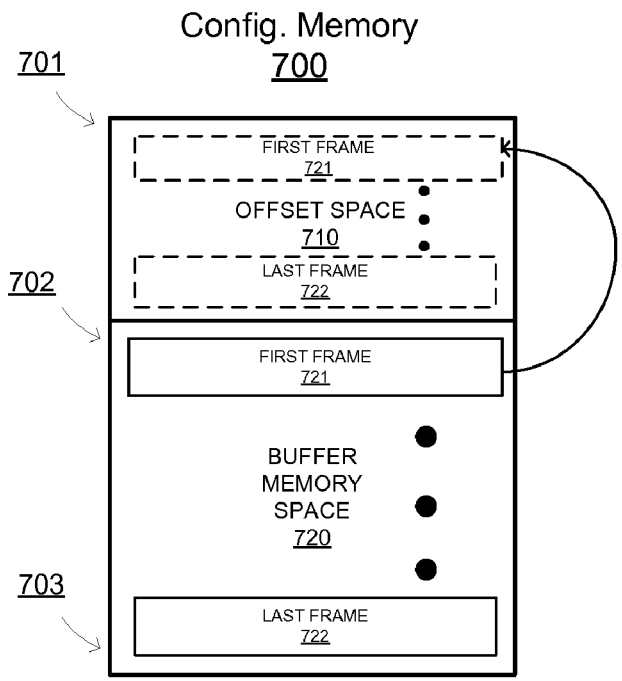
FIGS. 7A and 7B are block diagrams depicting respective exemplary embodiments of configuration memory used as buffer memory for storing compressed data.
Figure 7B:
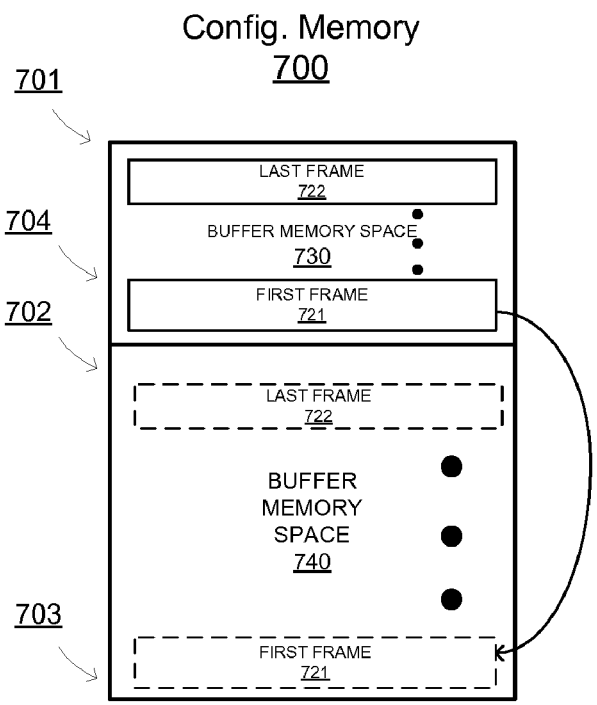

FIGS. 7A and 7B are block diagrams depicting respective exemplary embodiments of configuration memory 700 used as buffer memory for storing compressed data. It should be appreciated that configuration data is received in groups of data not as frames. In contrast to non-configuration formatted data having a one-to-one bitwise correspondence with the configuration data it represents, compressed data will not have such a one-to-one correspondence. Thus, encrypted data, from which decrypted bit streams may be obtained, may be written to correct locations initially in configuration buffer memory. Once such data is decrypted, it may be written back to the same location. However, stored compressed data takes less than the full amount of configuration memory that will be used when such data is decompressed.

An offset starting at location 701 of configuration buffer memory 700 is used to provide an offset space 710. Offset space 710 may be sufficient for storing at least one frame of configuration data.

A first compressed frame of configuration data 721 is stored beginning at location 702 of buffer memory space 720 for storing compressed data. A last compressed frame of configuration data 722 is stored ending at location 703 of buffer memory space 720.

As configuration memory buffer 700 is used on a first-in, first-out ("FIFO") basis, compressed data is decompressed, starting with a first frame 721 stored at location 702. Such first frame of data 721 is read from configuration buffer memory space 720 and decompressed. Decompressed data is written back into offset space 710. This avoids over-writing data. Accordingly, as this first frame of data 721 is read, location 702 of configuration memory space 720 becomes available as part of offset space 710. A next frame of compressed data may be accessed and written at a location in offset space 710.

Partial bit-streams, intended to be replicated, may be temporarily stored in configuration memory, and then read back and written to their multiple destinations. BRAM memory, not sufficiently large for storing a full bit-stream of configuration data may be used for storing partial bit-streams.

Alternatively, as illustratively shown in FIG. 7B, a first frame 721 may be written at location 704 in buffer memory space 730 for storing compressed configuration data. Subsequent frames may be written in buffer memory space 730 in reverse location order, such that a last frame of compressed configuration data 722 ends at a starting memory address or location 701 for buffer memory space 730.

A first frame of compressed configuration data 721 is read and decompressed. This decompressed first frame is written starting at an ending memory address 703 of buffer memory space 740 for storing decompressed configuration data. This continues with a next frame until a last frame 722 is read, decompressed and written to buffer memory space 740 in reverse order with respect to memory address relative to frame decompression order.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit having configuration memory, comprising:
   a configuration data interface;
   a microcontroller coupled to the configuration data interface for receiving encrypted configuration data, the microcontroller having access to at least one set of instructions for decrypting the encrypted configuration data;
   configuration memory coupled to the microcontroller; and
   a plurality of drivers associated with programmable resources of the integrated circuit for generating output signals controlled by configuration data stored in the configuration memory;
   the microcontroller configured to assert a disable signal to disable selected drivers of the plurality of drivers to create a non-contentious environment for buffering the encrypted configuration data in at least a portion of the configuration memory, the microcontroller configured to write the encrypted configuration data to the portion of the configuration memory and, responsive to the set of instructions, to read the encrypted configuration data back from the portion of the configuration memory for decryption and to activate the selected drivers of the plurality of drivers after the encrypted configuration data is read from the configuration memory, wherein decrypted configuration data is stored in the configuration memory to control the programmable resources after the selected drivers are activated.

2. The integrated circuit, according to claim 1, wherein the microcontroller is configured to activate the selected drivers for the portion of the configuration memory responsive to storing the decrypted configuration data in the portion of the configuration memory.

3. The integrated circuit, according to claim 2, wherein the microcontroller has access to a decompression set of instructions for decompressing the configuration data.

4. The integrated circuit, according to claim 2, wherein the microcontroller comprises a processor and memory, the processor for processing the set of instructions and the memory for storing the set of instructions.

5. The integrated circuit, according to claim 2, wherein the microcontroller comprises decryption key storage for storing a decryption key for the decryption.

6. The integrated circuit, according to claim 5, wherein the microcontroller comprises an address decoder and a read/write memory controller, the address decoder coupled to receive address information associated with the write of the encrypted configuration data to the configuration memory and configured to decode the address information received for the write of the encrypted configuration data to the configuration memory.

7. The integrated circuit, according to claim 6, wherein the microcontroller comprises a read/write memory controller for the write of the encrypted configuration data to the configuration memory and the read of the encrypted configuration data from the configuration memory.

8. A method for using configuration memory for buffer memory, comprising:
   obtaining configuration initialization information;
   obtaining instructions responsive to the configuration initialization information;
   implementing a plurality of drivers associated with programmable resources for generating output signals controlled by configuration data stored in a portion of the configuration memory;
   disabling selected drivers of the plurality of drivers to prevent creation of a contentious state irrespective of information stored in the portion of the configuration memory;
   receiving configuration data in a non-configuration data format;
   buffering the configuration data in the non-configuration data format in the portion of the configuration memory associated with the selected drivers of the plurality of drivers;
   reading the configuration data in the non-configuration format from the configuration memory;
   storing the configuration data in a configuration data format in the configuration memory after reading the configuration data in the non-configuration format to control the programmable resources after the selected drivers of the plurality of drivers are activated; and
   activating the selected drivers of the plurality of drivers.

9. The method, according to claim 8, wherein the instructions are for decryption of the configuration data, the decryption of the configuration data proceeding at a bit rate which is slower than a data rate at which the configuration data is received.

10. The method, according to claim 9, further comprising:
    obtaining a decryption key responsive to the configuration initialization information;
    authenticating an apparent source of the configuration data responsive to the decryption key; and
    decrypting the configuration data with the decryption key.

11. The method, according to claim 10, further comprising decompressing the configuration data to put the configuration data into the configuration data format.

12. The method, according to claim 11, further comprising error checking the configuration data in the configuration data format.

13. The method, according to claim 12, wherein storing the configuration data in the configuration data format comprises writing the configuration data in the configuration data format to another portion of the configuration memory not associated with the selected drivers of the plurality of drivers.

14. A method for using configuration memory for buffer memory, comprising:
    implementing a plurality of drivers associated with programmable resources for generating output signals controlled by configuration data stored in a portion of the configuration memory;
    rendering selected drivers of the plurality of drivers incapable of creating a contentious state irrespective of information stored in the portion of the configuration memory;
    receiving configuration data in a non-configuration data format;
    buffering the configuration data in the non-configuration data format in the portion of the configuration memory;
    reading the configuration data in the non-configuration data format from the configuration memory;
    storing the configuration data in a configuration data format in the configuration memory after reading the configuration data in the non-configuration data format to control the programmable resources after the selected drivers of the plurality of drivers are activated; and
    activating the selected drivers of the plurality of drivers.

15. The method, according to claim 14, wherein the configuration data in the non-configuration data format comprises encrypted data.

16. The method, according to claim 14, wherein the configuration data in the non-configuration data format comprises compressed data.

17. The method, according to claim 14, further comprising decrypting the configuration data in the non-configuration data format responsive to decryption instructions.

18. The method, according to claim 14, further comprising decompressing the configuration data in the non-configuration data format responsive to decompression instructions.

19. An apparatus for using configuration memory for buffer memory, comprising:

means for implementing a plurality of drivers associated with programmable resources for generating output signals controlled by configuration data stored in a portion of the configuration memory;

means for rendering selected drivers of the plurality of drivers incapable of creating a contentious state irrespective of information stored therein;

means for receiving configuration data in a non-configuration data format;

means for buffering the configuration data in the non-configuration data format in the portion of the configuration memory;

means for reading the configuration data in the non-configuration data format from the configuration memory;

means for storing the configuration data in a configuration data format in the configuration memory after reading the configuration data in a non-configuration data format to control the programmable resources after the selected drivers of the plurality of drivers are activated; and means for activating the selected drivers of the plurality of drivers.

20. An integrated circuit having configuration memory, comprising:

a configuration data interface;

a microcontroller coupled to the configuration data interface for receiving configuration data in a non-configuration data format, the microcontroller having access to at least one set of instructions for converting the configuration data to a configuration data format;

configuration memory coupled to the microcontroller;

a plurality of drivers associated with programmable resources of the integrated circuit for generating output signals controlled by configuration data stored in the configuration memory; and the microcontroller configured to assert a disable signal to disable selected drivers of the plurality of drivers to create a non-contentious environment for buffering the configuration data in the non-configuration data format in at least a portion of the configuration memory, the microcontroller configured to write the configuration data in the non-configuration data format to the portion of the configuration memory and, responsive to the set of instructions, to read the configuration data back from the portion of the configuration memory for conversion into the configuration data format and to activate the selected drivers of the plurality of drivers after the configuration data in the non-configuration data format is read from the configuration memory, wherein configuration data in the configuration data format is stored in the configuration memory to control the programmable resources after the selected drivers are activated.

21. The integrated circuit, according to claim 20, wherein the configuration data in the non-configuration data format is received at a line rate which is faster than a conversion rate for converting the configuration data from the non-configuration data format to the configuration data format.

22. The integrated circuit, according to claim 21, wherein the configuration data in the non-configuration data format is encrypted configuration data.

23. The integrated circuit, according to claim 22, wherein the configuration data in the non-configuration data format is compressed configuration data.

24. The integrated circuit, according to claim 23, wherein the configuration data in the non-configuration data format is encoded configuration data for error checking.

* * * * *